United States Patent
Vahid Far et al.

(10) Patent No.: US 9,647,638 B2
(45) Date of Patent: May 9, 2017

(54) ARCHITECTURE TO REJECT NEAR END BLOCKERS AND TRANSMIT LEAKAGE

(71) Applicant: QUALCOMM Incorporated, San Diego, CA (US)

(72) Inventors: Mohammad Bagher Vahid Far, San Jose, CA (US); Cheng-Han Wang, San Jose, CA (US); Jesse Aaron Richmond, Oakland, CA (US); Thinh Cat Nguyen, San Jose, CA (US); Abbas Komijani, Mountain View, CA (US); Yashar Rajavi, Mountain View, CA (US); Alireza Khalili, Sunnyvale, CA (US)

(73) Assignee: QUALCOMM Incorporated, San Diego, CA (US)

( * ) Notice: Subject to any disclaimer, the term of this patent is extended or adjusted under 35 U.S.C. 154(b) by 221 days.

(21) Appl. No.: 14/331,685

(22) Filed: Jul. 15, 2014

(65) Prior Publication Data

US 2016/0020752 A1    Jan. 21, 2016

(51) Int. Cl.
| | |
|---|---|
| G06F 17/10 | (2006.01) |
| H03H 11/04 | (2006.01) |
| H03H 11/12 | (2006.01) |
| H04B 1/10 | (2006.01) |
| H04B 1/525 | (2015.01) |

(52) U.S. Cl.
CPC ..... *H03H 11/0433* (2013.01); *H03H 11/1252* (2013.01); *H04B 1/109* (2013.01); *H04B 1/525* (2013.01)

(58) Field of Classification Search
USPC .................................................. 708/300–323
See application file for complete search history.

(56) References Cited

U.S. PATENT DOCUMENTS

| | | |
|---|---|---|
| 6,184,748 B1 | 2/2001 | Rao et al. |
| 6,188,281 B1 | 2/2001 | Smith et al. |

(Continued)

FOREIGN PATENT DOCUMENTS

| | | |
|---|---|---|
| GB | 2500067 A | 9/2013 |

OTHER PUBLICATIONS

Xu et al, "A Low-IF CMOS Simultaneous GPS Receiver Integrated in a Multimode Transceiver", IEEE 2007 Custom Intergrated Circuits Conference (CICC), pp. 107-110.*

(Continued)

*Primary Examiner* — Tan V. Mai
(74) *Attorney, Agent, or Firm* — Loza & Loza LLP

(57) ABSTRACT

A method and apparatus for minimizing transmit signal interference is provided. The method includes the steps of: receiving a signal and amplifying the received signal. The received signal is then mixed with an intermediate frequency signal to obtain a baseband modulated signal. The baseband modulated signal is first filtered in an RC filter. The resulting signal is then divided by a preselected amount and the first divided portion is sent to a main path of a biquad filter, which produces a first stage biquad filtered signal. The second portion of the divided signal is sent to an auxiliary path of the biquad filter, and produces a second filtered signal. The first and second signals are then recombined and sent to the second stage of the biquad filter, where further filtering takes place.

22 Claims, 8 Drawing Sheets

(56) References Cited

U.S. PATENT DOCUMENTS

| | | | |
|---|---|---|---|
| 6,417,737 B1 * | 7/2002 | Moloudi | H03B 21/01 |
| | | | 330/301 |
| 8,482,344 B2 | 7/2013 | Oishi | |
| 8,558,618 B2 | 10/2013 | Nussbaum et al. | |
| 8,594,603 B2 * | 11/2013 | Balankutty | H04B 1/12 |
| | | | 455/278.1 |
| 8,594,605 B2 | 11/2013 | Katsube et al. | |
| 2004/0095513 A1 * | 5/2004 | Kamata | H03D 3/007 |
| | | | 348/726 |
| 2005/0253647 A1 | 11/2005 | Hagari | |

OTHER PUBLICATIONS

Khatri H., et al., "An Active Transmitter Leakage Suppression Technique for CMOS SAW-Less CDMA Receivers," IEEE Journal of Solid-State Circuits, Aug. 2010, vol. 45 (8), pp. 1590-1601.
International Search Report and Written Opinion—PCT/US2015/036267—ISA/EPO—Sep. 30, 2015.

* cited by examiner

ARCHITECTURE TO REJECT NEAR END BLOCKERS AND TRANSMIT LEAKAGE

FIELD

The present disclosure relates generally to wireless communication systems, and more particularly to a method for rejecting near end blockers and transmit leakage in a receiver module.

BACKGROUND

Wireless communication devices have become smaller and more powerful as well as more capable. Increasingly users rely on wireless communication devices for mobile phone use as well as email and Internet access. At the same time, devices have become smaller in size. Devices such as cellular telephones, personal digital assistants (PDAs), laptop computers, and other similar devices provide reliable service with expanded coverage areas. Such devices may be referred to as mobile stations, stations, access terminals, user terminals, subscriber units, user equipments, and similar terms.

A wireless communication system may support communication for multiple wireless communication devices at the same time. In use, a wireless communication device may communicate with one or more base stations by transmissions on the uplink and downlink. Base stations may be referred to as access points, Node Bs, or other similar terms. The uplink or reverse link refers to the communication link from the wireless communication device to the base station, while the downlink or forward link refers to the communication from the base station to the wireless communication devices.

Wireless communication systems may be multiple access systems capable of supporting communication with multiple users by sharing the available system resources, such as bandwidth and transmit power. Examples of such multiple access systems include code division multiple access (CDMA) systems, time division multiple access (TDMA) systems, frequency division multiple access (FDMA) systems, wideband code division multiple access (WCDMA) systems, global system for mobile (GSM) communication systems, enhanced data rates for GSM evolution (EDGE) systems, and orthogonal frequency division multiple access (OFDMA) systems.

In a receiver, such as a wireless receiver, desired signals may be blocked due to an adjacent high strength signal. This strong signal may saturate the receive circuitry and block the weaker primary receive signal. This occurs when the front end receive circuitry and automatic gain control (AGC) react to the stronger signal, and reduce the front end amplification. When this happens, the desired primary channel receive signal may be lost in the background noise.

Transmit jammer leakage may be a powerful blocker for the receive path in frequency duplex division (FDD) mode in many bands of a wireless communication system, such as the long-term evolution (LTE) band. In the LTE bands receive spacing may be as little as a few tens of MHz. This spacing leads to receiver front end design challenges as filtering of near end blockers in RF is made nearly impossible due to the lack of high quality (Q) of chip components. In addition to generating nonlinearity components the transmit jammer may saturate the first stage of the base band (BB) filter in high gain modes in the presence of weak signals, as described above. Common filtering techniques such as RC filtering is less effective because the rejection is only a few dBs. Thus, there is a need in the art for a method and apparatus to reject near end blockers and transmit leakage.

SUMMARY

Embodiments contained in the disclosure provide a method of minimizing transmit signal interference. The method includes the steps of: receiving a signal and amplifying the received signal. The received signal is then mixed with an intermediate frequency signal to obtain a baseband modulated signal. The baseband modulated signal is then first filtered in an RC filter. The resulting signal is then divided by a preselected amount and the first divided portion is sent to a main path of a biquad filter, which produces a first stage biquad filtered signal. The second portion of the divided signal is sent to an auxiliary path of the biquad filter, and produces a second filtered signal. The first and second signals are then recombined and sent to the second stage of the biquad filter, where further filtering takes place.

A further embodiment provides an apparatus for minimizing transmit signal interference. The apparatus includes a front end receiver that includes: an antenna, a low noise amplifier, a transformer, a mixer and an RC filter. In addition, the apparatus provides a main biquad filtering path and at least one auxiliary biquad filtering path.

A still further embodiment provides an apparatus for minimizing transmit signal interference, the apparatus comprising: means for receiving a signal; means for amplifying the received signal; means for mixing the received signal with an intermediate frequency signal to obtain a baseband modulated signal; means for filtering the baseband modulated signal in a first filter; means for dividing the first filtered baseband modulated signal by a preselected amount; means for sending a first divided portion of the baseband modulated signal to a main path of a biquad filter, producing a first biquad filtered signal; means for sending a second divided portion of the baseband modulated signal to an auxiliary path of the biquad filter, producing a second biquad filtered signal; means for recombining the first biquad filtered signal with the second biquad filtered signal before a second stage of the biquad filter; and means for filtering the recombined biquad filtered signal in the second stage of the biquad filter.

A yet further embodiment provides a non-transitory computer readable media that includes program instructions, which when executed by a processor cause the processor to perform a method comprising the steps of: receiving a signal; amplifying that received signal; and then mixing the received signal with an intermediate frequency signal to obtain a baseband modulated signal. The baseband modulated signal is then filtered with an RC filter and is then dividing by a preselected amount. The first divided portion of the baseband modulated signal is sent to a main path of a biquad filter, and produces a first biquad filtered signal. The second divided portion of the baseband modulated signal is sent to an auxiliary path of the biquad filter and produces a second biquad filtered signal. The first and second divided signals are then recombined and send to a second stage of the biquad filter. The recombined signal is then filtered in the second stage of the biquad filter.

DETAILED DESCRIPTION

Figure 1:
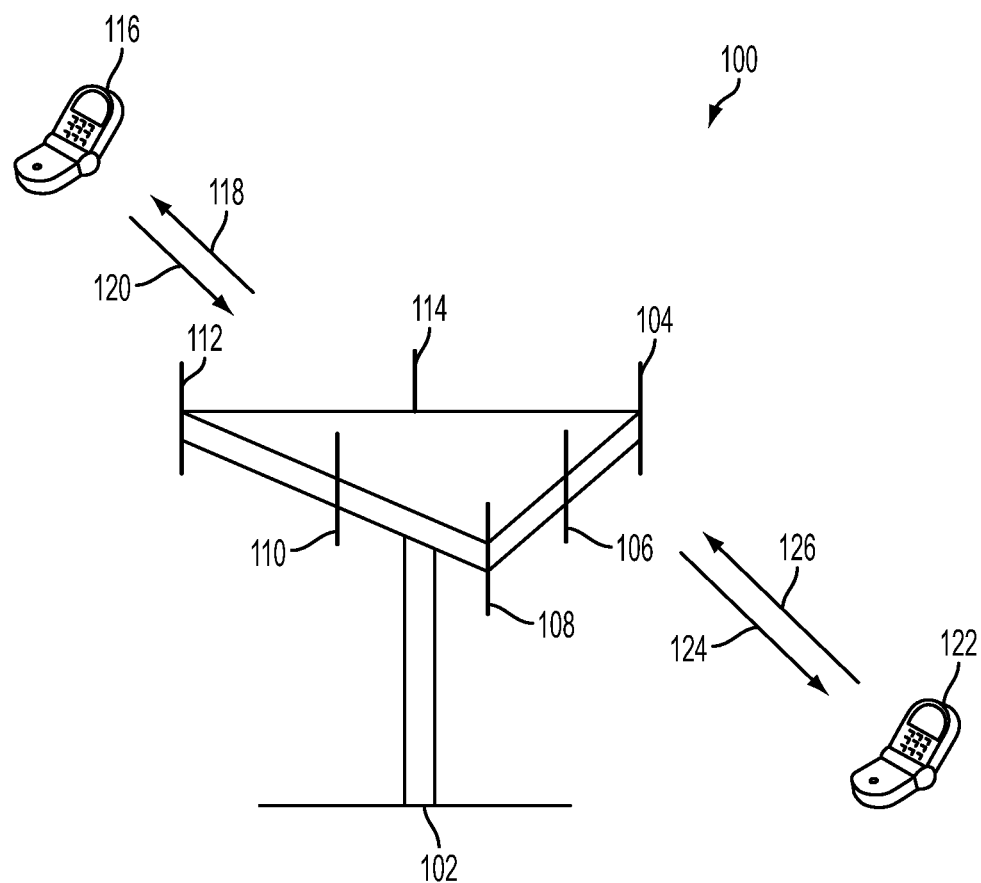
FIG. 1 illustrates a wireless multiple-access communication system, in accordance with certain embodiments of the disclosure.

The detailed description set forth below in connection with the appended drawings is intended as a description of exemplary embodiments of the present invention and is not intended to represent the only embodiments in which the present invention can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the invention. It will be apparent to those skilled in the art that the exemplary embodiments of the invention may be practiced without these specific details. In some instances, well-known structures and devices are shown in block diagram form in order to avoid obscuring the novelty of the exemplary embodiments presented herein.

As used in this application, the terms "component," "module," "system," and the like are intended to refer to a computer-related entity, either hardware, firmware, a combination of hardware and software, software, or software in execution. For example, a component may be, but is not limited to being, a process running on a processor, an integrated circuit, a processor, an object, an executable, a thread of execution, a program, and/or a computer. By way of illustration, both an application running on a computing device and the computing device can be a component. One or more components can reside within a process and/or thread of execution and a component may be localized on one computer and/or distributed between two or more computers. In addition, these components can execute from various computer readable media having various data structures stored thereon. The components may communicate by way of local and/or remote processes such as in accordance with a signal having one or more data packets (e.g., data from one component interacting with another component in a local system, distributed system, and/or across a network, such as the Internet, with other systems by way of the signal).

Furthermore, various aspects are described herein in connection with an access terminal and/or an access point. An access terminal may refer to a device providing voice and/or data connectivity to a user. An access wireless terminal may be connected to a computing device such as a laptop computer or desktop computer, or it may be a self-contained device such as a cellular telephone. An access terminal can also be called a system, a subscriber unit, a subscriber station, mobile station, mobile, remote station, remote terminal, a wireless access point, wireless terminal, user terminal, user agent, user device, or user equipment. A wireless terminal may be a subscriber station, wireless device, cellular telephone, PCS telephone, cordless telephone, a Session Initiation Protocol (SIP) phone, a wireless local loop (WLL) station, a personal digital assistant (PDA), a handheld device having wireless connection capability, or other processing device connected to a wireless modem. An access point, otherwise referred to as a base station or base station controller (BSC), may refer to a device in an access network that communicates over the air-interface, through one or more sectors, with wireless terminals. The access point may act as a router between the wireless terminal and the rest of the access network, which may include an Internet Protocol (IP) network, by converting received air-interface frames to IP packets. The access point also coordinates management of attributes for the air interface.

Moreover, various aspects or features described herein may be implemented as a method, apparatus, or article of manufacture using standard programming and/or engineering techniques. The term "article of manufacture" as used herein is intended to encompass a computer program accessible from any computer-readable device, carrier, or media. For example, computer readable media can include but are not limited to magnetic storage devices (e.g., hard disk, floppy disk, magnetic strips . . . ), optical disks (e.g., compact disk (CD), digital versatile disk (DVD). . . ), smart cards, and flash memory devices (e.g., card, stick, key drive . . . ), and integrated circuits such as read-only memories, programmable read-only memories, and electrically erasable programmable read-only memories.

Various aspects will be presented in terms of systems that may include a number of devices, components, modules, and the like. It is to be understood and appreciated that the various systems may include additional devices, components, modules, etc. and/or may not include all of the devices, components, modules etc. discussed in connection with the figures. A combination of these approaches may also be used.

Other aspects, as well as features and advantages of various aspects, of the present invention will become apparent to those of skill in the art through consideration of the ensuring description, the accompanying drawings and the appended claims.

FIG. 1 illustrates a multiple access wireless communication system 100 according to one aspect. An access point 102 (AP) includes multiple antenna groups, one including 104 and 106, another including 108 and 110, and an additional one including 112 and 114. In FIG. 1, only two antennas are shown for each antenna group, however, more or fewer antennas may be utilized for each antenna group. Access terminal 116 (AT) is in communication with antennas 112 and 114, where antennas 112 and 114 transmit information to access terminal 116 over downlink or forward link 118 and receive information from access terminal 116 over uplink or reverse link 120. Access terminal 122 is in communication with antennas 106 and 108, where antennas 106 and 108 transmit information to access terminal 122 over downlink or forward link 124, and receive information from access terminal 122 over uplink or reverse link 126. In a frequency division duplex (FDD) system, communication link 118, 120, 124, and 126 may use a different frequency for communication. For example, downlink or forward link 118 may use a different frequency than that used by uplink or reverse link 120.

Each group of antennas and/or the area in which they are designed to communicate is often referred to as a sector of the access point. In an aspect, antenna groups are each designed to communicate to access terminals in a sector of the areas covered by access point 102.

In communication over downlinks or forward links 118 and 124, the transmitting antennas of an access point utilize beamforming in order to improve the signal-to-noise ration (SNR) of downlinks or forward links for the different access terminals 116 and 122. Also, an access point using beamforming to transmit to access terminals scattered randomly through its coverage causes less interference to access terminals in neighboring cells than an access point transmitting through a single antenna to all its access terminals.

An access point may be a fixed station used for communicating with the terminals and may also be referred to as a Node B, an evolved Node B (eNB), or some other terminology. An access terminal may also be called a mobile station, user equipment (UE), a wireless communication device, terminal or some other terminology. For certain aspects, either the AP 102, or the access terminals 116, 122 may utilize the techniques described below to improve performance of the system.

Figure 2:
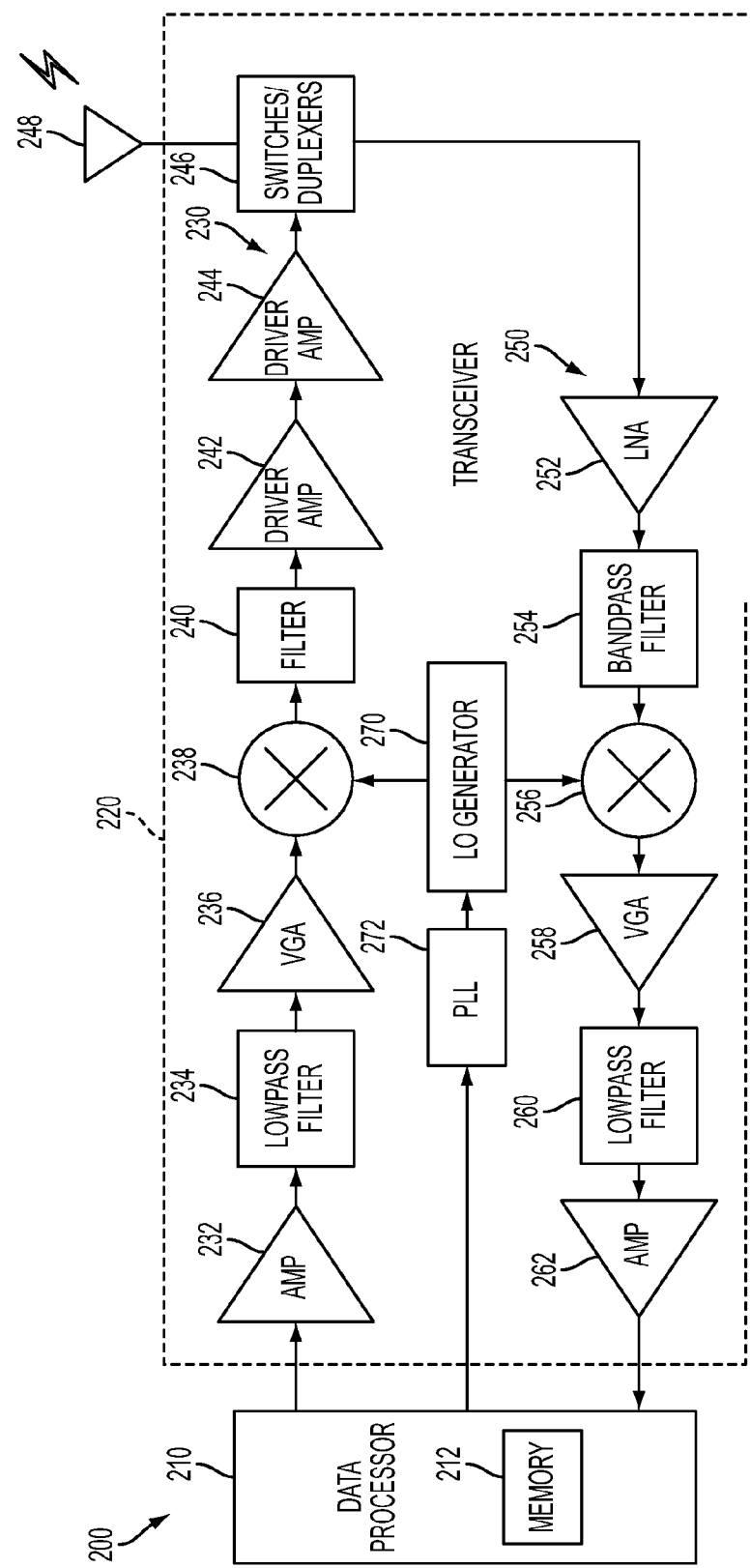
FIG. 2 is a block diagram of a wireless communication system in accordance with embodiments of the disclosure.

FIG. 2 shows a block diagram of an exemplary design of a wireless communication device 200. In this exemplary design, wireless device 200 includes a data processor 210 and a transceiver 220. Transceiver 220 includes a transmitter 230 and a receiver 250 that support bi-directional wireless communication. In general, wireless device 200 may include any number of transmitters and any number of receivers for any number of communication systems and any number of frequency bands.

In the transmit path, data processor 210 processes data to be transmitted and provides an analog output signal to transmitter 230. Within transmitter 230, the analog output signal is amplified by an amplifier (Amp) 232, filtered by a lowpass filter 234 to remove images caused by digital-to-analog conversion, amplified by a VGA 236, and upconverted from baseband to RF by a mixer 238. The upconverted signal is filtered by a filter 240, further amplified by a driver amplifier, 242 and a power amplifier 244, routed through switches/duplexers 246, and transmitted via an antenna 249.

In the receive path, antenna 248 receives signals from base stations and/or other transmitter stations and provides a received signal, which is routed through switches/duplexers 246 and provided to receiver 250. Within receiver 250, the received signal is amplified by an LNA 252, filtered by a bandpass filter 254, and downconverted from RF to baseband by a mixer 256. The downconverted signal is amplified by a VGA 258, filtered by a lowpass filter 260, and amplified by an amplifier 262 to obtain an analog input signal, which is provided to data processor 210.

FIG. 2 shows transmitter 230 and receiver 250 implementing a direct-conversion architecture, which frequency converts a signal between RF and baseband in one stage. Transmitter 230 and/or receiver 250 may also implement a super-heterodyne architecture, which frequency converts a signal between RF and baseband in multiple stages. A local oscillator (LO) generator 270 generates and provides transmit and receive LO signals to mixers 238 and 256, respectively. A phase locked loop (PLL) 272 receives control information from data processor 210 and provides control signals to LO generator 270 to generate the transmit and receive LO signals at the proper frequencies.

FIG. 2 shows an exemplary transceiver design. In general, the conditioning of the signals in transmitter 230 and receiver 250 may be performed by one or more stages of amplifier, filter, mixer, etc. These circuits may be arranged differently from the configuration shown in FIG. 2. Some circuits in FIG. 2 may also be omitted. All or a portion of transceiver 220 may be implemented on one or more analog integrated circuits (ICs), RF ICs (RFICs), mixed-signal ICs, etc. For example, amplifier 232 through power amplifier 244 in transmitter 230 may also be implemented on an RFIC. Driver amplifier 242 and power amplifier 244 may also be implemented on another IC external to the RFIC.

Data processor 210 may perform various functions for wireless device 200, e.g., processing for transmitter and received data. Memory 212 may store program codes and data for data processor 210. Data processor 210 may be implemented on one or more application specific integrated circuits (ASICs) and/or other ICs.

When receiving a desired signal in the environment described in FIG. 1, it is likely that other signals are being transmitted and received nearby. In some cases, these signals may be stronger than the desired receive signal. When this occurs, such strong signals, which may also be known as transmit jammers or signals blockers, may saturate the RF circuitry. This blocks the weaker desired primary receive signal. The front end and AGC circuitry react to the stronger signal and reduce front end amplification, causing the desired primary receive channel to be lost in the background noise.

This transmit jammer leakage is a powerful blocker of the desired RF path, particularly in FDD mode. In addition, it is of particular concern in long-term evolution (LTE) systems because in many LTE bands frequency spacing may be as few as 10 MHz. As one example, consider LTE band 12 which requires receiver front end design to be capable of handling spacing of 30 MHz, or LTE band 2 with a 45 MHz spacing. This poses significant design challenges as filtering of these near end blocking signals requires quality filters. Providing quality filters is also difficult as filtering of near end blocking signals is further complicated due to the lack of high Q of chip components.

Filtering is complicated because in addition to generating non-linear components, a transmit jamming signal may saturate the first stage of the baseband filter (BB) in high gain modes in the presence of the weak signal. Attempts to mitigate this problem has used RC filtering to filter out transmit leakage after the mixer, however, the rejection is only a few dB of improvement. Such small improvement is less effective in the narrow spacing of transmit and receive signals in LTE systems. Other proposed solutions used saw filters, which are expensive and use considerable power, and RC filtering immediately after the mixer, however, this may require an additional mixer. Adding components further complicates production and testing.

Embodiments described herein address the problem of transmit jamming signals by adding an auxiliary path in parallel to the main path of the biquad filter stage. This auxiliary path carries half the current from the mixer output. A biquad filter is a type of linear filter that implements a transfer function that is the ration of two quadratic functions. Biquad filters are typically active filters and may be implemented with a single amplifier biquad (SAB) or two-integrator loop technology. The SAB topology uses feedback to generate complex poles and may generate complex zeros. The feedback moves the real poles of an RC circuit in order to generate the proper filter characteristics. The two-integrator loop topology is derived from rearranging a biquadratic transfer function. The rearrangement equates one signal with the sum of another signal, its integral, and the integral's integral. The rearrangement reveals a state variable filter structure. By using different states as output, any kind of second order filter may be implemented.

Figure 3:
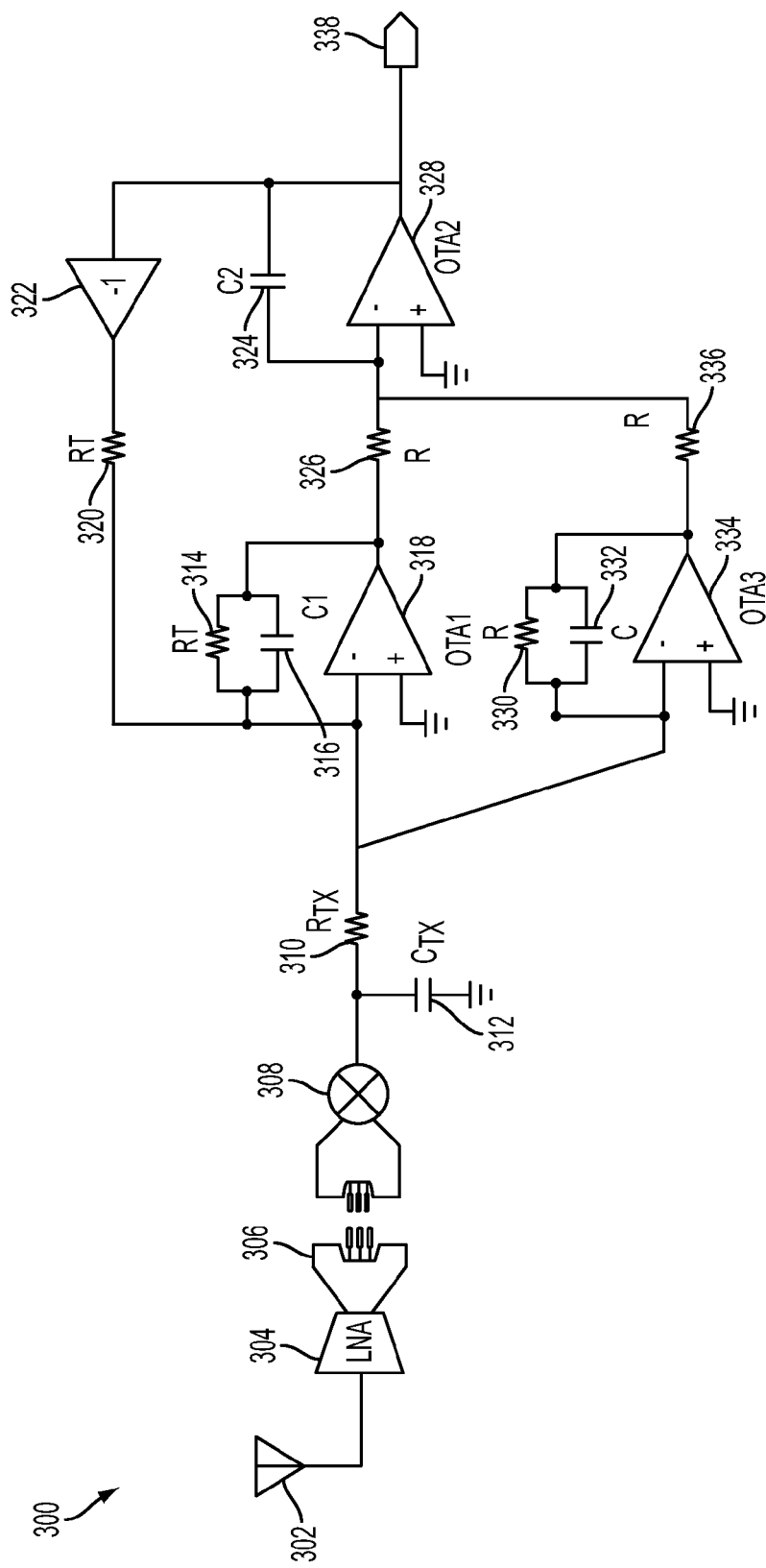
FIG. 3 is a block diagram of an apparatus for rejection near end blockers and transmit leakage, according to an embodiment of the disclosure.

FIG. 3 depicts an apparatus for filtering out near end blocking signals and transmit leakage. The apparatus, 300 includes biquad filter stages as described below. An auxiliary path is added in parallel with the main path biquad filter stage. This auxiliary path carries half the current from the mixer output. A receive signal is received at antenna 302 and sent to low noise amplifier (LNA) 304. LNA 304 is coupled to RF transformer 306, shown here as an air core transformer. RF transformer 306 is connected to mixer 308. The mixer output is sent to an RC filter, consisting of transmit resistor 310 and transmit capacitor 312. The RC filter provides initial filtering of the received signal. The output from the RC filter is sent to two paths of the biquad filter, a main path and an auxiliary path. The main path is sent to the first stage of the biquad filter assembly, to RT resistor 314 and capacitor C1 316. The main path leads from the RC filter to the input of the main path biquad filter operational transconductance amplifier (OTA) 318. A two stage negative feedback loop is formed with RT 314, C1 316 and RT resistor 320. RT resistor 320 is provided on the input of offset amplifier 322. Offset amplifier 322 acts as an active attenuator as part of the two stage negative feedback look. The first stage of the biquad filter provides for the partially filtered signal to be provided to the negative input of the second stage OTA2 328. The negative path input to OTA 328 also includes capacitor C2 324. OTA2 328 also receives input on the negative input pin from the auxiliary path. The auxiliary path begins after transmit resistor 310 and begins with an input to the negative pin of OTA3 334 also obtains input on the negative pin from resistor R 330 and capacitor C332. The input from OTA3 334 is also provided as input to OTA2 328, but passes through line resistor 336.

Each OTA is typically comprised of two stages, with the second stage acting as the driving stage. The second stage is also used for combining the main path and auxiliary paths. The first stage of the OTA typically consumes less than 1 MA of current. The second stage of the OTA may be a class AB amplifier, which consumes some current in the absence of a signal.

The RC filter jamming alone is not capable of providing the required level of rejection where weak receive signals are found. In addition, the first stage of the LNA 304 cannot provide filtering with only one pole and would be saturated in situations where high transmit leakage occurs in conjunction with weak signal reception.

In some situations, the output from the biquad filter provides sufficient filtering if the first stage of the biquad filter can tolerate the blocking transmit signals. In such cases, the second stage of biquad filtering is not needed. When the transmit jamming signals are strong, the first stage of the biquad filter is saturated and the second stage provided as embodiments herein, is needed to suppress the jamming transmit signals and allow recovery of the weaker desired receive signal.

The swing of the input signal level at OTA1 318 and OTA3 334 is half (−6 dB) of the swing provided by conventional architecture, while gain remains the same as in conventional architecture. This reduction enables more efficient filtering with fewer additional components. The number of auxiliary paths is not limited, and it may be desirable to add additional paths that may be disabled when not in use. Adding additional auxiliary paths may also provide addition reduction and margin for swing. The number of additional paths that may be added is limited by the gross bandwidth of the OTA, which may limit the improvement from additional auxiliary paths. The reason for less improvement from successive auxiliary paths is that each added auxiliary path contributes additional noise to the base band output, which in the case of high gain, could be negligible.

Figure 4:
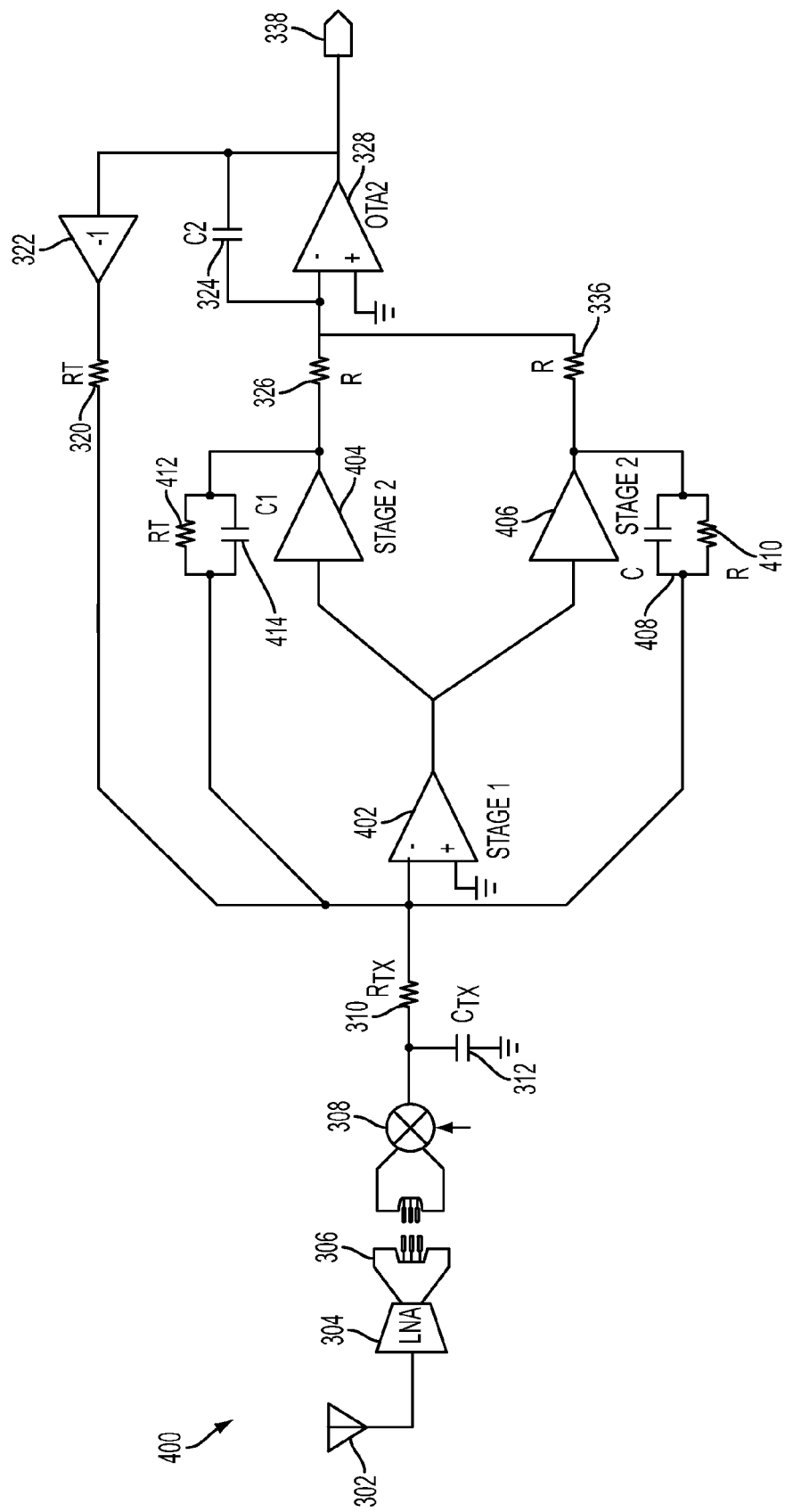
FIG. 4 is a block diagram of a further embodiment of an apparatus for rejection of near end blockers and transmit leakage, according to an embodiment of the disclosure.

The auxiliary path depicted in FIGS. 3 and 4 provides another path for the desired signal and operates to reduce the swing requirement at the main path output by 6 dB, in some cases. In other transmit situations the swing path output may be reduced by a different amount.

FIG. 4 illustrates a further embodiment which allows for the first stage of the OTA to be shared by both the main and auxiliary paths. Each OTA has two stages. In the embodiment described below, stage one is shared between the main and auxiliary paths. The assembly, 400 also includes antenna 302 for receiving signals. Initial signal reception is the same as described for FIG. 3, with the received signal passing through LNA 304 and RF transformer 306, and mixer 308. Initial stage RC filtering is provided by RTx 310 and CTx 312. The signal is passed to RT 320 and −1 offset amplifier 322; RT 412 and C1 414; and also to OTA stage 1 402. From OTA 402 the signal path is split between two stage 2 OTAs, 404 and 406. The main path continues with the output from OTA 404 passing through lines resistor 326 and on to OTA2 328 and C2 324. The split path is routed to OTA 406. The output of OTA 406 is combined with the output from C 408 and R 410 before passing through lines resistor 336. Once through line resistor 336 the auxiliary path is provided as input to OTA2 328. The output of OTA2 328 is provided as output 338.

Figure 5:
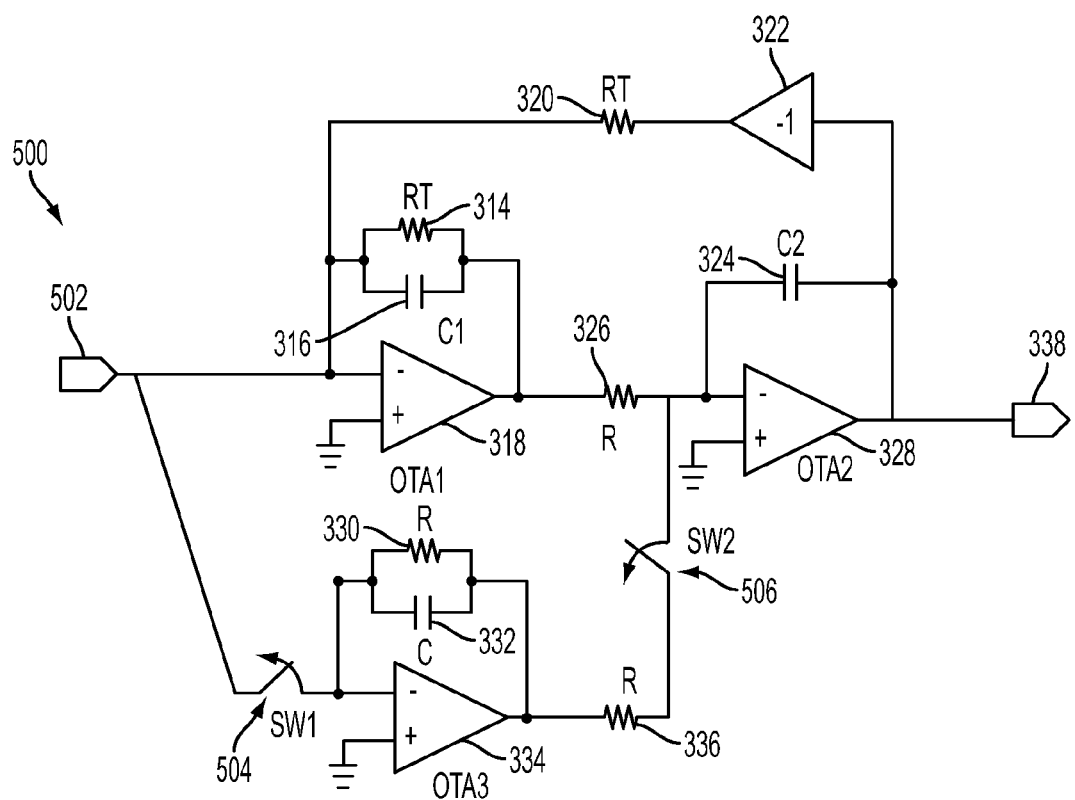
FIG. 5 is a block diagram of a further embodiment of an apparatus for rejection of near end blockers and transmit leakage, according to an embodiment of the disclosure.

FIG. 5 illustrates a further embodiment with switches provided to disable the auxiliary path. Switch 1 (SW1) receives input 502 and allows for a portion of the received signal to be diverted into the auxiliary path. Switch 2 (SW2) 506 provides the output of OTA3 334 to be provided as input to OTA2 328. When SW1 504 and SW2 506 are open, the auxiliary path is disabled and has no effect on the main biquad filtering path. Both SW1 502 and SW2 504 are connected to the virtual ground nodes of OTA1 318 and OTA 2 326.

Figure 6:
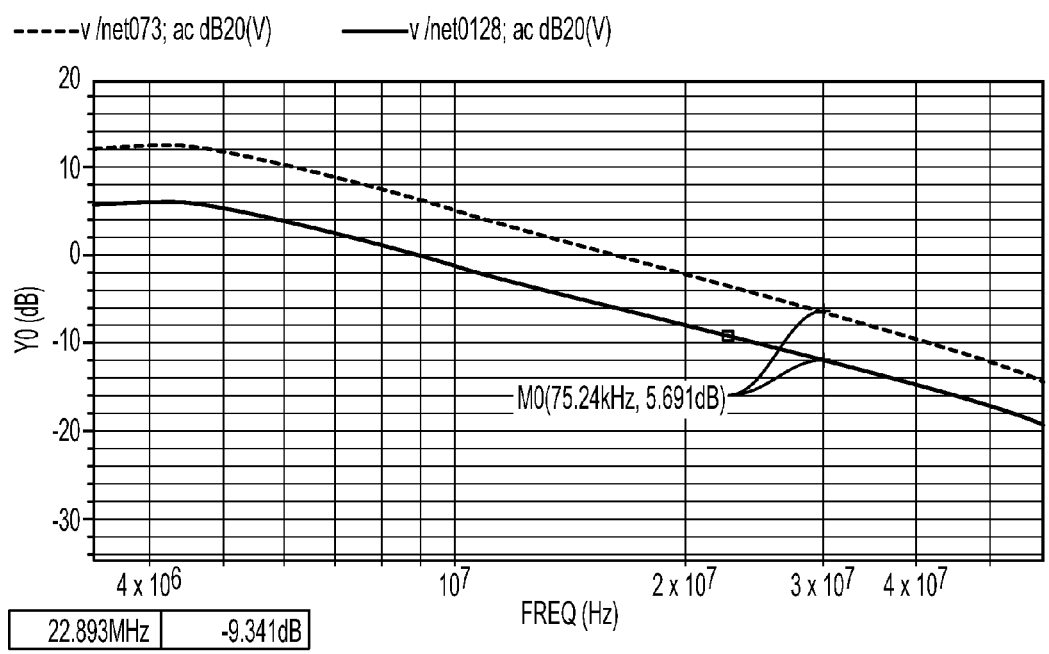
FIG. 6 depicts the simulation results of the performance of an apparatus for rejection of near end blockers and transmit leakage, according to embodiments of the disclosure.

FIG. 6 illustrates the simulation results of embodiments described above. The results show the improvements from the use of the auxiliary path. The improved filtering results from the base band first stage not being saturated, as the auxiliary path to the base band filtering is immediately after the mixer, resulting in improved filtering.

Figure 7:
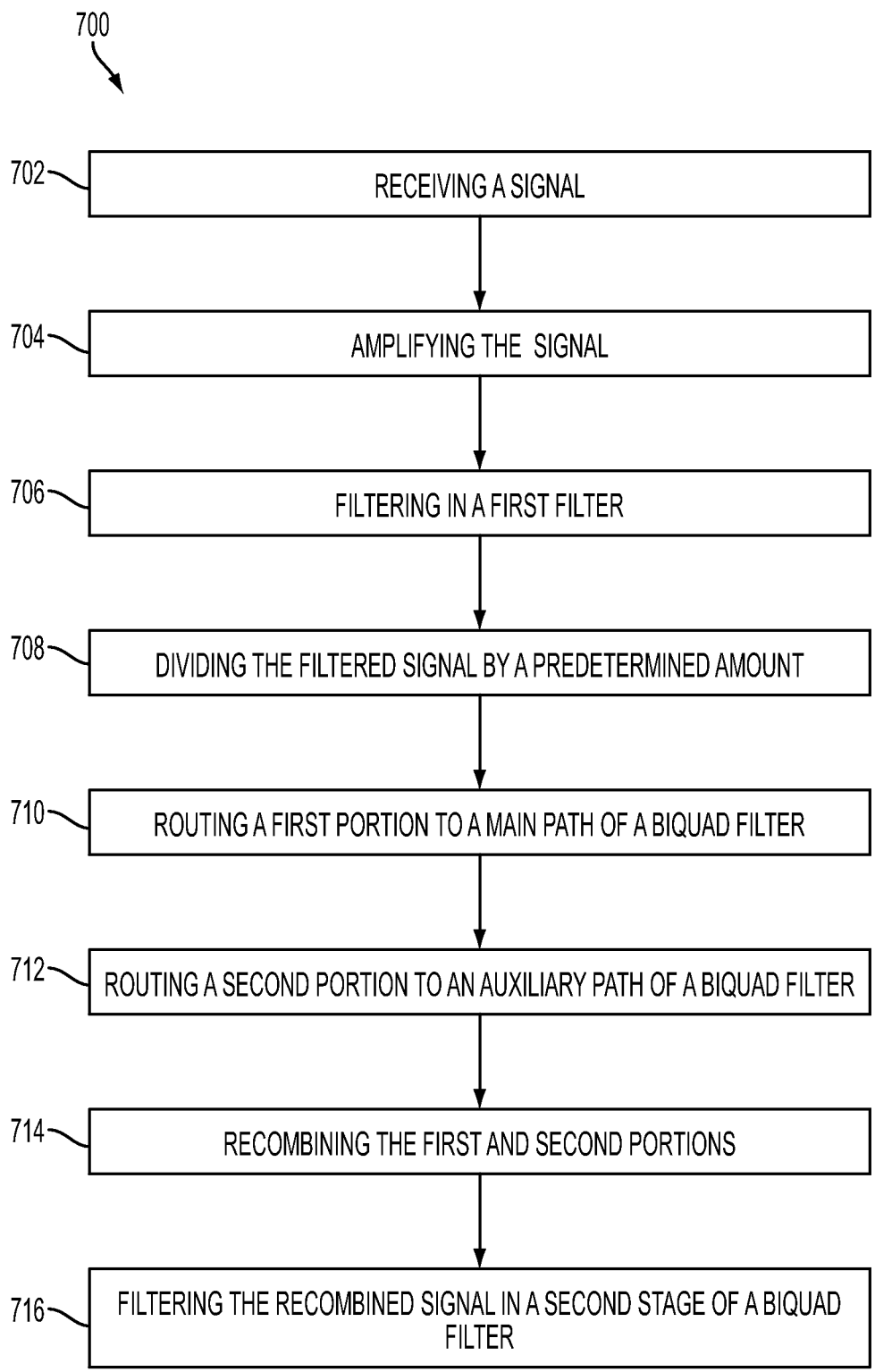
FIG. 7 is a flowchart of the steps in minimizing transmit signal interference of a desired receive signal, according to an embodiment of the disclosure.

FIG. 7 is a flowchart of the steps of minimizing transmit signal interference of a weaker received signal using the apparatus described above. The method, 700 begins with receiving a signal at step 702. The weaker received signal is then amplified in a low noise amplifier in step 704. An RC filter provides initial filtering of the received signal in step 708. The RC filtered signal is then divided by a predetermined number in step 708. This predetermined number may correspond to the number of main and auxiliary biquad filter paths being utilized. In the event that the first OTA is shared, dividing of the RC filtered signal may occur after the first stage of biquad filtering.

In step 710 the first portion of the RC filtered signal is routed to a main path of the biquad filter. The second portion of the RC filtered signal is routed to an auxiliary path of the biquad filter in step 712. Once both or all of the divided signal portions have been routed through the first stage of the biquad filter, they are recombined in step 714. The recombined signal is then passed to the second stage of the biquad filter for additional filtering in step 716.

Figure 8:
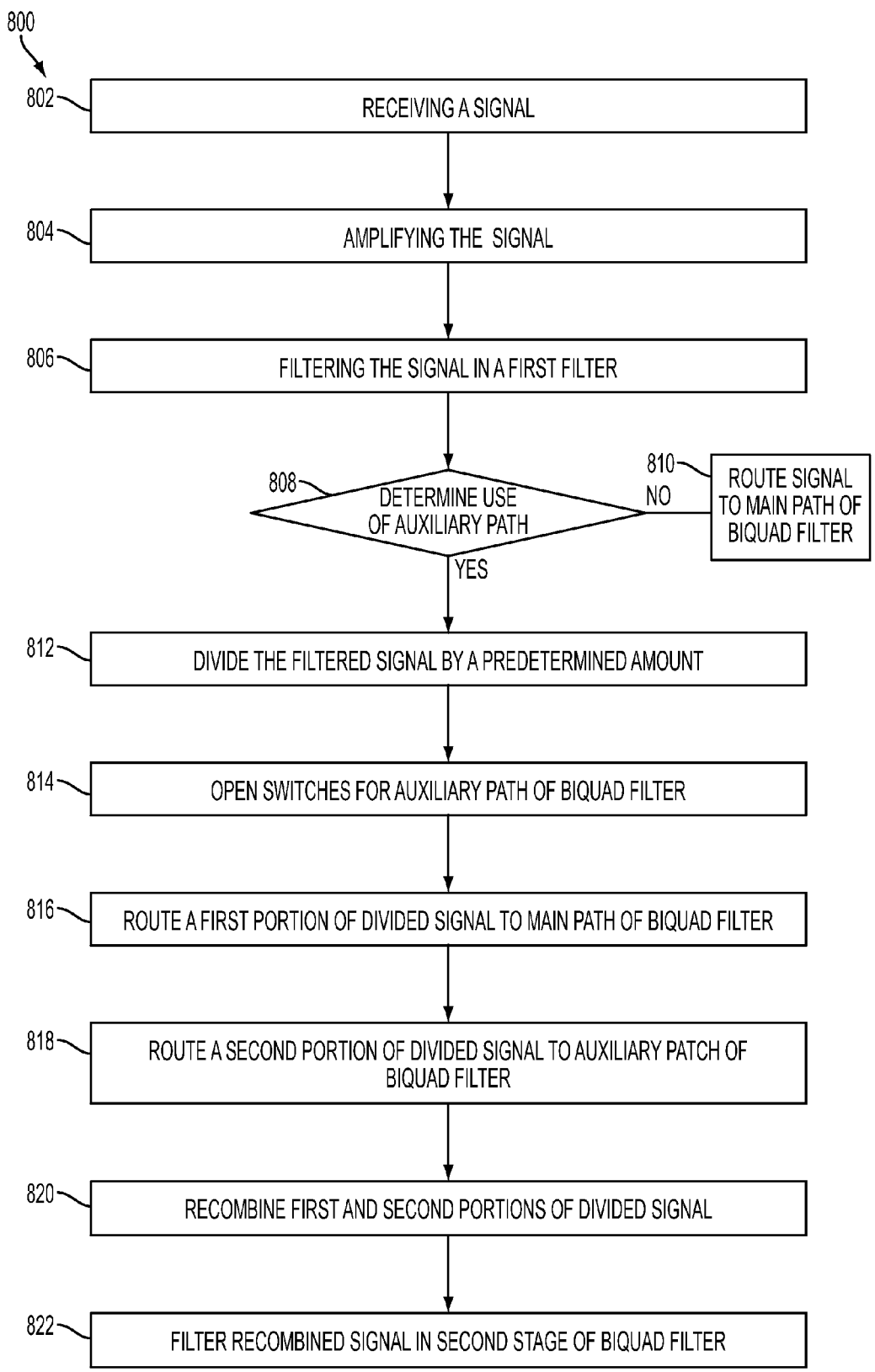
FIG. 8 is a flowchart of the steps in minimizing transmit signal interference of a desired receive signal utilizing a switchable auxiliary path.

FIG. 8 provides a flowchart of the steps of a method using an auxiliary path that may be switched on or off as needed. The method, 800, begins with the receiving of a signal at step 802. The signal is then amplified in step 804. In step 806, an RC filter provides first filtering of the signal. In step 808, a determination of whether to use an auxiliary path for additional biquad filtering is made. If the decision is made not to use the auxiliary path, the signal is routed to the main path of the biquad filter in step 810. If the determination indicates that the auxiliary path is to be used, the signal is divided by a predetermined path in step 812.

The number of auxiliary paths is not limited, and more may be used than are depicted, however, the scope of the disclosure provides for the use of more auxiliary paths than are depicted. The first stage of the biquad filter, the OTA, may be shared, with the division of the signal into main and auxiliary paths occurring after the first stage of the biquad filter.

If the auxiliary path is used switches along the auxiliary path are opened in step 814, to route the signal through the auxiliary path and into the second stage of the biquad filter. In step 816 a first portion of the divided signal is routed to the main path of the biquad filter. In step 818 a second portion of the divided signal is routed to the auxiliary path of the biquad filter. The first and second portions of the divided signal are recombined at step 820. The recombined signal is then filtered in the second stage of the biquad filter in step 822.

The auxiliary path determination may be performed by a processor, which may also direct the setting of the switches. In embodiments where multiple auxiliary paths are provided the disclosure provides that the paths may be reconfigured to provide the desired number of auxiliary paths by a processor.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the exemplary embodiments disclosed herein may be implemented as electronic hardware, computer software, or combinations of both. To clearly illustrate this interchangeability of hardware and software, various illustrative components blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments of the invention.

The various illustrative logical blocks, modules, and circuits described in connection with the exemplary embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

In one or more exemplary embodiments, the functions described may be implemented in hardware, software, firmware, or any combination thereof If implemented in software, the functions may be stored on or transmitter over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM EEPROM, CD-ROM or other optical disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

The previous description of the disclosed exemplary embodiments is provided to enable any person skilled in the art to make or use the invention. Various modifications to these exemplary embodiments will be readily apparent to those skilled in the art, and the generic principles defined herein may be applied to other embodiments without departing from the spirit or scope of the invention. Thus, the present invention is not intended to be limited to the exemplary embodiments shown herein but is to be accorded the widest scope consistent with the principles and novel features disclosed herein.

What is claimed is:

1. A method of minimizing transmit signal interference, comprising:
   receiving a signal;
   amplifying the received signal;
   mixing the received signal with an intermediate frequency signal to obtain a baseband modulated signal;
   filtering the baseband modulated signal in a first filter;
   dividing the first filtered baseband modulated signal by a preselected amount;
   sending a first divided portion of the baseband modulated signal to a main path of a biquad filter, producing a first biquad filtered signal;
   sending a second divided portion of the baseband modulated signal to an auxiliary path of the biquad filter, producing a second biquad filtered signal;

recombining the first biquad filtered signal with the second biquad filtered signal before a second stage of the biquad filter; and filtering the recombined biquad filtered signal in the second stage of the biquad filter.

2. The method of claim 1, wherein the first filtered baseband modulated signal is divided among a main biquad filtering path and multiple auxiliary biquad filter paths.

3. The method of claim 2, wherein the multiple auxiliary biquad filter paths are parallel to one another.

4. The method of claim 1, wherein the auxiliary biquad filter path is a parallel path.

5. The method of claim 1, wherein the multiple auxiliary biquad filter paths are parallel to one another.

6. The method of claim 1, wherein prior to routing the first filtered baseband modulated signal a determination regarding use of an auxiliary path is made.

7. The method of claim 1, further comprising determining whether to use multiple auxiliary paths.

8. An apparatus for minimizing transmit signal interference, comprising:
an antenna configured to receive a signal and connected to a low-noise amplifier, the low noise amplifier connected to a RF transformer;
a mixer configured to receive an output of the RF transformer;
an RC filter configured to receive an output of the mixer and initially filter the signal;
a main biquad filtering path configured to receive a first portion of an output signal from an output of the RC filter;
at least one auxiliary biquad filtering path configured to receive a second portion of the output signal from the output of the RC filter; and
a biquad filter stage coupled to the main biquad filtering path and the least one auxiliary biquad filtering path, the biquad filter stage being configured to filter a combined signal from the main biquad filtering path and the least one auxiliary biquad filtering path.

9. The apparatus of claim 8 further comprising multiple auxiliary biquad filtering paths in parallel.

10. The apparatus of claim 8, wherein the main biquad filter path, the at least one auxiliary biquad filtering path, and the biquad filter stage are included in a biquad filter, wherein a first stage of the biquad filter is shared between the main biquad filtering path and the at least one auxiliary biquad filtering path.

11. An apparatus for minimizing transmit signal interference, comprising:
means for receiving a signal;
means for amplifying the received signal;
means for mixing the received signal with an intermediate frequency signal to obtain a baseband modulated signal;
means for filtering the baseband modulated signal in a first filter;
means for dividing the first filtered baseband modulated signal by a preselected amount;
means for sending a first divided portion of the baseband modulated signal to a main path of a biquad filter, producing a first biquad filtered signal;
means for sending a second divided portion of the baseband modulated signal to an auxiliary path of the biquad filter, producing a second biquad filtered signal;
means for recombining the first biquad filtered signal with the second biquad filtered signal before a second stage of the biquad filter; and
means for filtering the recombined biquad filtered signal in the second stage of the biquad filter.

12. The apparatus of claim 11 further comprising means for dividing the first filtered baseband modulated signal among a main biquad filtering path and multiple auxiliary biquad filter paths.

13. The apparatus of claim 11, wherein the means for dividing the first filtered baseband modulated signal routes the auxiliary biquad filter path to a parallel path.

14. The apparatus of claim 11, wherein the means for dividing routes the divided signal to multiple auxiliary biquad filter parallel paths.

15. The apparatus of claim 11, wherein the means for filtering shares a first stage of a biquad filter between a main biquad filtering path and an auxiliary biquad filtering path.

16. A non-transitory computer readable media including program instructions which when executed by a processor cause the processor to perform a method of comprising the steps of:
receiving a signal;
amplifying the received signal;
mixing the received signal with an intermediate frequency signal to obtain a baseband modulated signal;
filtering the baseband modulated signal in a first filter;
dividing the first filtered baseband modulated signal by a preselected amount;
sending a first divided portion of the baseband modulated signal to a main path of a biquad filter, producing a first biquad filtered signal;
sending a second divided portion of the baseband modulated signal to an auxiliary path of the biquad filter, producing a second biquad filtered signal;
recombining the first biquad filtered signal with the second biquad filtered signal before a second stage of the biquad filter; and
filtering the recombined biquad filtered signal in the second stage of the biquad filter.

17. The non-transitory computer readable media including the program instructions of claim 16, further comprising:
instructions for dividing the first filtered baseband modulated signal among a main biquad filtering path and multiple auxiliary biquad filter paths.

18. The non-transitory computer readable media including the program instructions of claim 16, further comprising:
routing the first filtered baseband modulated signal to the parallel auxiliary biquad filter path.

19. The non-transitory computer readable media including the program instructions of claim 16, further comprising:
routing the first filtered baseband modulated signal to the multiple auxiliary biquad filter paths that are parallel to one another.

20. The non-transitory computer readable media including the program instructions of claim 16, further comprising:
determining whether to route wherein the first filtered baseband modulated signal to an auxiliary path.

21. The non-transitory computer readable media including the program instructions of claim 16, further comprising:
providing instructions for opening switches to allow use of at least one auxiliary path.

22. The non-transitory computer readable media including the program instructions of claim 16, further comprising:
providing instructions for opening switches to allow use of multiple auxiliary paths.

* * * * *